(12) United States Patent
Jiang et al.

(10) Patent No.: US 10,951,142 B2
(45) Date of Patent: Mar. 16, 2021

(54) CONTROL SYSTEM AND CONTROL METHOD

(71) Applicant: Hangzhou Sanhua Research Institute Co., Ltd., Zhejiang (CN)

(72) Inventors: Xiaojun Jiang, Zhejiang (CN); Likun Yang, Zhejiang (CN); Edwin J. Stanke, Zhejiang (CN); Jinlan Xie, Zhejiang (CN)

(73) Assignee: Hangzhou Sanhua Research Institute Co., Ltd., Zhejiang (CN)

( * ) Notice: Subject to any disclaimer, the term of this patent is extended or adjusted under 35 U.S.C. 154(b) by 0 days.

(21) Appl. No.: 16/604,553

(22) PCT Filed: May 17, 2018

(86) PCT No.: PCT/CN2018/087274
§ 371 (c)(1),
(2) Date: Oct. 10, 2019

(87) PCT Pub. No.: WO2018/214801
PCT Pub. Date: Nov. 29, 2018

(65) Prior Publication Data
US 2020/0161996 A1    May 21, 2020

(30) Foreign Application Priority Data

May 24, 2017  (CN) .......................... 2017 1 0371724

(51) Int. Cl.
*H02P 6/182*        (2016.01)
*H02K 7/00*         (2006.01)

(52) U.S. Cl.
CPC ............. *H02P 6/182* (2013.01); *H02K 7/006* (2013.01)

(58) Field of Classification Search
CPC ................................ H02P 6/182; H02K 7/006
(Continued)

(56) References Cited

U.S. PATENT DOCUMENTS 3,638,480 A    2/1972  Calud
9,473,059 B2 * 10/2016  Omata .................... H02P 21/20
(Continued)

FOREIGN PATENT DOCUMENTS

CN    201509176 U    6/2010
CN    203522143 U    4/2014
(Continued)

OTHER PUBLICATIONS

International Search Report and Written Opinion for International Application No. PCT/CN2018/087274, dated Aug. 2, 2018.
(Continued)

*Primary Examiner* — David Luo
(74) *Attorney, Agent, or Firm* — Wolf, Greenfield & Sacks, P.C.

(57) ABSTRACT

A control system and a control method, used for controlling a motor. The control system includes a central processing module and a drive control module. In a period in which a voltage is not applied to any phase coil of the motor, the drive control module collects voltages of the phase coil, converts the voltages of the coil into digital signals and stores the digital signals. The central processing module reads the digital signals from the drive control module, accumulates the digital signals to obtain an accumulated value, and determines the operating condition of the motor according to a relationship between the accumulated value and a preset threshold, thereby improving the reliability of the motor control.

20 Claims, 8 Drawing Sheets

(58) Field of Classification Search
USPC .................. 318/400.06, 400.04, 400.01, 700
See application file for complete search history.

(56) References Cited

U.S. PATENT DOCUMENTS

| | | |
|---|---|---|
| 2007/0120519 A1 | 5/2007 | Sakamoto et al. |
| 2009/0153093 A1 | 6/2009 | Pinewski et al. |
| 2010/0194325 A1 | 8/2010 | Dixon et al. |
| 2011/0181229 A1 | 7/2011 | Galic et al. |
| 2015/0158314 A1 | 6/2015 | Miyashita |

FOREIGN PATENT DOCUMENTS

| | | | |
|---|---|---|---|
| CN | 104691103 A | 6/2015 | |
| CN | 105391350 A | 3/2016 | |
| JP | 2011-259525 A | 12/2011 | |

OTHER PUBLICATIONS

Extended European Search Report for European Application No. 18805756.6, dated Dec. 15, 2020.
Office Action for Korean Application No. 10-2019-7030990, dated Jan. 20, 2021.

\* cited by examiner

CONTROL SYSTEM AND CONTROL METHOD

This application is a national stage filing under 35 U.S.C. 371 of International Patent Application Serial No. PCT/CN2018/087274, filed on May 17, 2018, which claims the priority to Chinese Patent Application No. 201710371724.0, filed May 24, 2017. The entire contents of these applications are incorporated herein by reference in their entirety.

FIELD

The present application relates to the field of control technology, and in particular to a control system and a control method.

BACKGROUND

In the conventional technology, a controller determines a theoretical position according to a back electromotive force of a motor coil, and then sends a drive signal to a motor according to the theoretical position to control the operation of the motor. However, during the operation of the motor, there is a situation where the theoretical position of the motor determined according to the back electromotive force does not match an actual position of the motor when the motor is stuck or stalled, while the controller still sends the drive signal to the motor according to the theoretical position, so that the motor cannot run to a target position according to the requirements of the controller, resulting in unreliable control.

Therefore, there is a need to improve the conventional technology to solve the above technical issues.

SUMMARY

An object of the present application is to provide a control system and a control method, which are advantageous for improving the reliability of the control.

In order to achieve the above object, a control system is provided according to the present application. The control system is capable of controlling a motor and includes a central processing module and a drive control module;

when the motor is running, the drive control module is configured to sample a voltage of a phase coil of the motor, to which no voltage is applied, during a period in which no voltage is applied to any phase coil of the motor, and convert the sampled voltage of the phase coil of the motor, to which no voltage is applied, into a digital signal;

the control system is configured to store the digital signal, and update the digital signal in real time during the period in which no voltage is applied to any phase coil of the motor;

the central processing module is configured read the digital signal, and the control system is configured to convert the digital signal into a conversion value according to an abnormality probability of the motor running abnormally; and the central processing module is configured to sequentially accumulate the conversion values to obtain an accumulated value, and determine an operating state of the motor according to a relationship between the accumulated value and a preset threshold.

Optionally, the control system being configured to convert the digital signal into a conversion value according to an abnormality probability of the motor running abnormally is implemented as follows: the control system is configured to convert the digital signal into a first conversion value when the abnormality probability of the motor is higher than a preset probability threshold; and convert the digital signal into a second conversion value when the abnormality probability of the motor is lower than the preset probability threshold, wherein an absolute value of the first conversion value is greater than an absolute value of the second conversion value.

Optionally, the preset threshold is a positive number, and the first conversion value is a positive number; if the motor is in a normal operating state, the conversion value corresponding to the digital signal at least includes a negative number; and the accumulated value has a minimum value, and when the accumulated value is less than the minimum value, the minimum value is assigned to the accumulated value; and when the accumulated value is greater than the preset threshold, it is determined that the operating state of the motor is an abnormal operation.

Optionally, the preset threshold is a negative number, and the first conversion value is a negative number; if the motor is in the normal operating state, the conversion value corresponding to the digital signal at least includes a positive number; and the accumulated value has a maximum value, and when the accumulated value is greater than the maximum value, the maximum value is assigned to the accumulated value; and when the accumulated value is less than the preset threshold, it is determined that the operating state of the motor is the abnormal operation.

Optionally, the central processing module is further configured to set an initial value for the accumulated value, a type of the initial value is the same as a type of the preset threshold, and the accumulated value is equal to a sum of a previous accumulated value and the conversion value obtained by converting a current digital signal, wherein the first accumulated value is equal to the sum of the initial value and the conversion value converted from the digital signal read for the first time.

Optionally, one full step of motor operation includes at least two micro-steps and the drive control module further includes a micro-step register; and the micro-step register is configured to store a current micro-step value of the motor, and the period in which no voltage is applied to any phase coil of the motor corresponds to a same micro-step value, and a moment when the central processing module reads the digital signal does not belong to the period in which no voltage is applied to any phase coil of the motor.

Optionally, one period, in which no voltage is applied to any phase coil of the motor, is included between the two adjacent moments when the central processing module reads the digital signal.

Optionally, the central processing module at least reads the digital signal once between the two adjacent periods in which no voltage is applied to any phase coil of the motor.

Optionally, the abnormal operation includes motor stalling; and the central processing module is further configured to control a speed of the motor to avoid a speed corresponding to one or more resonance intervals of the motor, and the speed corresponding to the resonance intervals of the motor is related to properties of the motor itself.

The present application also discloses a control method for controlling a motor, the motor is controlled by the control system, and the control system includes a central processing module and a drive control module;

when the motor is running, the drive control module is configured to sample a voltage of a phase coil of the motor, to which no voltage is applied, during a period in which no voltage is applied to any phase coil of the motor, and convert the voltage of the phase coil of the motor, to which no voltage is applied, into a digital signal;

the control system is configured to store the digital signal, and update the digital signal in real time during the period in which no voltage is applied to any phase coil of the motor;

the central processing module is configured to read the digital signal and perform the control method, and the control method includes the following steps:

a1, reading a preset threshold $bemf_{thr}$;

a2, reading a digital signal $bemf_i$, wherein i represents the number of times the digital signal is read, and i=1, 2 . . . ;

a3, converting, according to an abnormality probability, the digital signal $bemf_i$ into a corresponding conversion value $EQUIbemf_i$, wherein i represents the number of times the digital signal is read, and i=1, 2 . . . ;

a4, calculating an accumulated value $bemftotal_i$ according to an equation $bemftotal_i=bemftotal_{i-1}+EQUIbemf_i$, wherein i represents the number of times the digital signal is read, i=1, 2 . . . , $bemftotal_{i-1}$ is a previous accumulated value, and when i=1, the accumulated value $bemftotal_0$;

a5, comparing the accumulated value $bemftotal_i$ with the preset threshold $bemf_{thr}$; and a6, determining whether an absolute value of the accumulated value $bemftotal_i$ is greater than an absolute value of the preset threshold $bemf_{thr}$, and if yes, determining an operating state of the motor, and otherwise proceeding to Step a2.

The present application further discloses another control method for controlling a motor, the motor is controlled by the control system, and the control system includes the central processing module and the drive control module;

when the motor is running, the drive control module is configured to sample a voltage of a phase coil of the motor, to which no voltage is applied, during a period in which no voltage is applied to any phase coil of the motor, and convert the voltage of the phase coil of the motor, to which no voltage is applied, into a digital signal;

the control system is configured to store the digital signal, and update the digital signal in real time during the period in which no voltage is applied to any phase coil of the motor;

the central processing module is configured to read the digital signal and perform the control method, and the control method includes the following steps:

a1, reading a preset threshold $bemf_{thr}$ and setting an initial value $bemftotal_0$;

a2, reading a digital signal $bemf_i$, wherein i represents the number of times the digital signal is read, and i=1, 2 . . . ;

a3, converting, according to an abnormality probability, the digital signal $bemf_i$ into a corresponding conversion value $EQUIbemf_i$, wherein i represents the number of times the digital signal is read, and i=1, 2 . . . ;

a4, calculating an accumulated value $bemftotal_i$ according to an equation $bemftotal_i=bemftotal_{i-1}+EQUIbemf_i$, wherein i represents the number of times the digital signal is read, i=1, 2 . . . , $bemftotal_{i-1}$ is a previous accumulated value, and when i=1, the accumulated value $bemftotal_1=bemftotal_0+EQUIbemf_1$;

a5, comparing the accumulated value $bemftotal_i$ with the preset threshold $bemf_{thr}$; and a6, determining whether an absolute value of the accumulated value $bemftotal_i$ is greater than an absolute value of the preset threshold $bemf_{thr}$ by the central processing module, and if yes, determining an operating state of the motor, and otherwise proceeding to Step a2.

Optionally, the control method further includes: determining the motor is in an abnormal operation state and generating an abnormal signal by the central processing module when the absolute value of the accumulated value $bemftotal_i$ is greater than that of the preset threshold $bemf_{thr}$.

Optionally, the control method further includes Step b3 between Step a2 and Step a3;

Step b3, determining whether a moment, when the central processing module reads the digital signal, belongs to the period in which no voltage is applied to any phase coil of the motor, and if yes, proceeding to Step a2, and otherwise proceeding to Step a3.

Optionally, the control method further includes Step b31 after Step b3;

Step b31, determining whether there is one period, in which no voltage is applied to any phase coil of the rotor, between two adjacent moments when the digital signal is read, and if yes proceeding to Step a3, and otherwise proceeding to Step a2.

Optionally, the control method further includes Step b31 after Step b3.

Step b31, determining whether the digital signal is read once between two adjacent periods in which no voltage is applied to any phase coil of the motor, and if yes, proceeding to Step a3, and otherwise proceeding to Step a2.

Optionally, the abnormal operation includes motor stalling, and the control method further includes Step b2 after or before Step a1;

Step b2, controlling a speed of the motor to avoid resonance intervals of the motor, wherein a speed corresponding to the resonance intervals of the motor is related to properties of the motor itself.

Compared with the conventional technology, in the control system provided by the present application, the drive control module samples the voltage of the phase coil, to which no voltage is applied, when there is no voltage is applied to any phase coil of the motor, and converts the voltage of the phase coil into the digital signal, and stores the digital signal. The central processing module reads the digital signal and converts the digital signal to obtain the conversion value, and sequentially accumulates the conversion values to obtain the accumulated value, and determines the operating state of the motor according to the relationship between the accumulated value and the preset threshold. The central processing module converts the digital signal to obtain the conversion value based on the magnitude of the abnormality probability, and accumulates the conversion values to determine the operating state of the motor. Since some accumulated values may counteract each other, which is advantageous for eliminating occasional misjudgment, the reliability of determining the operating state of the motor may be improved.

DETAILED DESCRIPTION OF EMBODIMENTS

Figure 1:
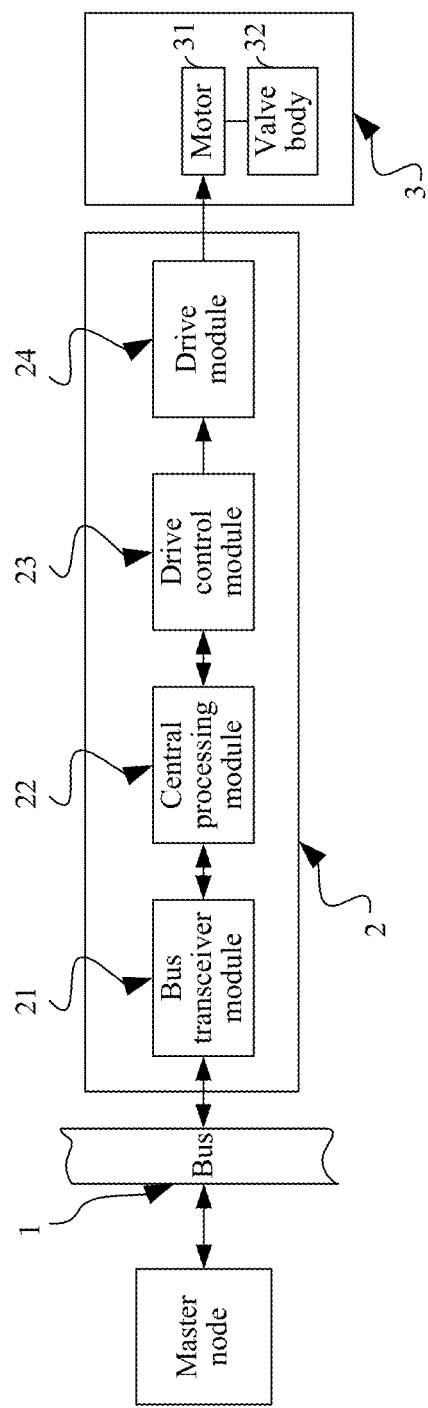
FIG. 1 is a schematic functional diagram of a first embodiment of a control system according to the present application.

The present application will be further described below in conjunction with the accompanying drawings and specific embodiments.

An electronic expansion valve is applicable to an air conditioning system. The air conditioning system further includes a compressor, a condenser and an evaporator, and the electronic expansion valve is configured to control a flow rate of a refrigerant from the condenser to the evaporator. The electronic expansion valve moves according to the requirements of the control system. The electronic expansion valve includes a motor and a valve body. The stepping motor includes a coil and a rotor. The control system includes a central processing module and a drive control module, and the central processing module sends a control signal based on an operating state of the motor to control the action of the stepping motor. The central processing module may be integrated into a controller of the air conditioning system or may be a controller integrated in a superior computer of the air conditioning system, such as a controller of a vehicle. In this embodiment, the drive control module samples a voltage of one phase coil with no voltage being applied when no voltage is applied to any phase coil of the motor, and converts the voltage of this phase coil into a digital signal and stores the digital signal. The central processing module reads the digital signal and converts the digital signal to obtain a conversion value, and sequentially accumulates the conversion values to obtain an accumulated value. The central processing module determines the operating state of the motor according to a relationship between the accumulated value and a preset threshold. In this way, the central processing module converts the digital signal to obtain the conversion value according to the magnitude of the abnormality probability, and accumulates the conversion values to determine the operating state of the motor, such that some accumulated values may counteract each other, which is advantageous for eliminating occasional misjudgment and for improving the reliability of determining the operating state of the motor.

In this embodiment, the operating state of the motor includes an abnormal operation and a normal operation. The abnormal operation of the motor includes motor stalling, motor running at abnormal speed and the like. This embodiment is described by taking motor stalling as an example.

In addition, the motor in this embodiment may be applied to a domestic air conditioning system, and may be applied to a vehicle air conditioning system. The motor in the present application may be applied to an electronic expansion valve, an electronic water valve and other products driven by a motor. A detailed description is given hereinafter with the motor, the control system and the control method being applied to the electronic expansion valve. This embodiment is described in conjunction with the control system and control method applied to the vehicle air conditioning system.

The control system in this embodiment is described below with reference to FIG. 1, FIG. 2 and FIG. 3, respectively.

Referring to FIG. 1, in this embodiment, the control system 2 includes a bus transceiver module 21, a central processing module 22, a drive control module 23 and a drive module 24. The electronic expansion valve 3 includes a motor 31 and a valve body 32. The motor 31 is a stepping motor. The control system 2 can control the operation of the motor 31. The control system 2 is connected with a bus 1 and the motor 31. The bus transceiver module 21 is configured to receive a control signal sent by the bus 1 and send the control signal to the central processing module 22. The central processing module 22 performs a method calculation after reading a digital signal from the drive control module 23 and determines an operating state of the stepping motor 31. The drive control module 23 samples a voltage of a phase coil to which no voltage is applied when no voltage is applied to any phase coil of the motor, and converts the voltage of this phase coil into a digital signal and stores the digital signal. The drive module 24 is configured to receive a control signal sent by the drive control module 23, and control on and off of the current supply of the stepping motor 31. The above bus transceiver module 21 may be a LIN transceiver module or other communication module such as a CAN transceiver module or a PWM communication module.

Figure 2:
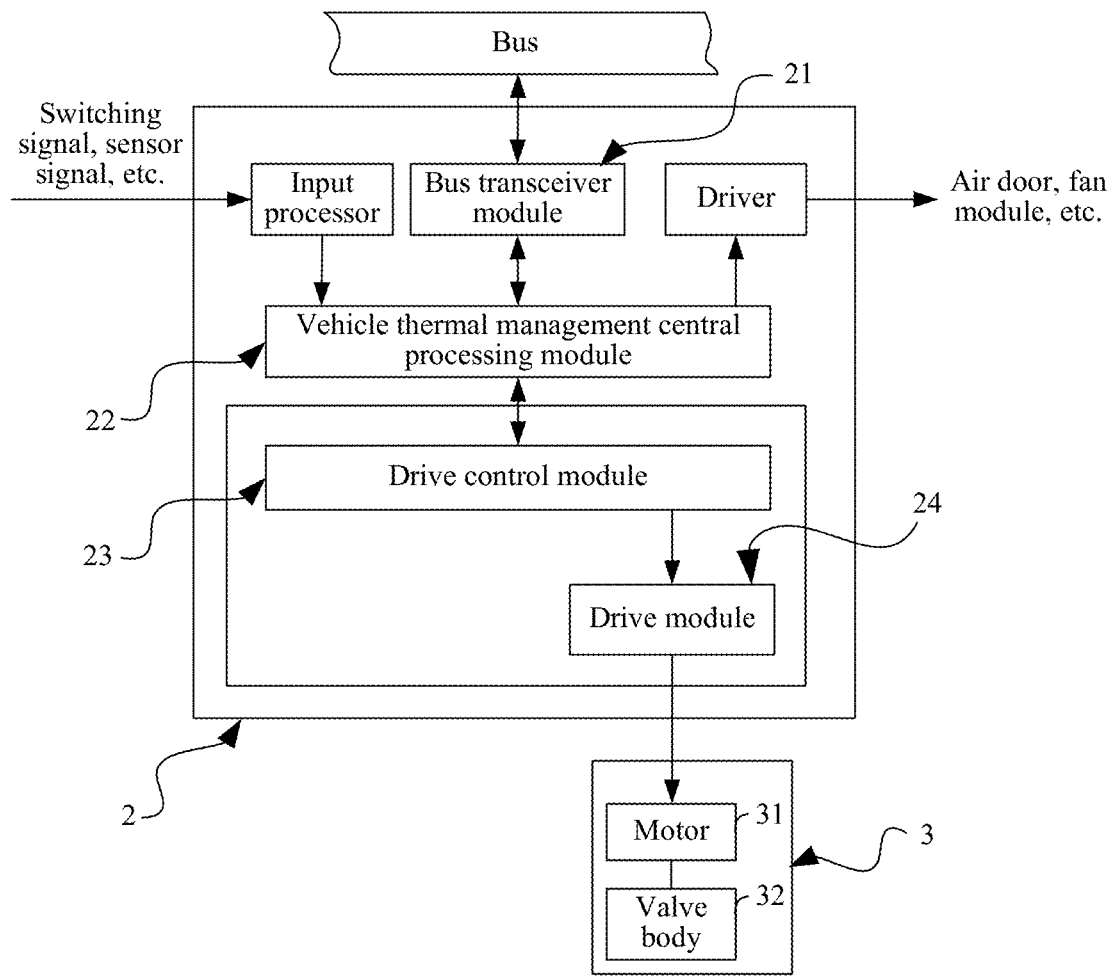
FIG. 2 is a schematic functional diagram of a second embodiment of the control system according to the present application.

Referring to FIG. 2, in this embodiment, the control system 2 includes a bus transceiver module 21, a central processing module, a drive control module 23 and a drive module 24. Compared with the first embodiment, the central processing module is integrated into a vehicle thermal management central processing module 22. In addition to sending a control signal to the drive control module 23, the vehicle thermal management central processing module 22 also sends control signals to other devices of the vehicle. With such arrangement of the central processing module, the space is saved and the connection of the control system is simplified. The bus transceiver module 21 is configured to receive a control signal sent by a LIN bus or/and a CAN bus 1 and send the control signal to the vehicle thermal management central processing module 22, where the bus transceiver module 21 may also be other communication module, such as a PWM communication module.

Figure 3:
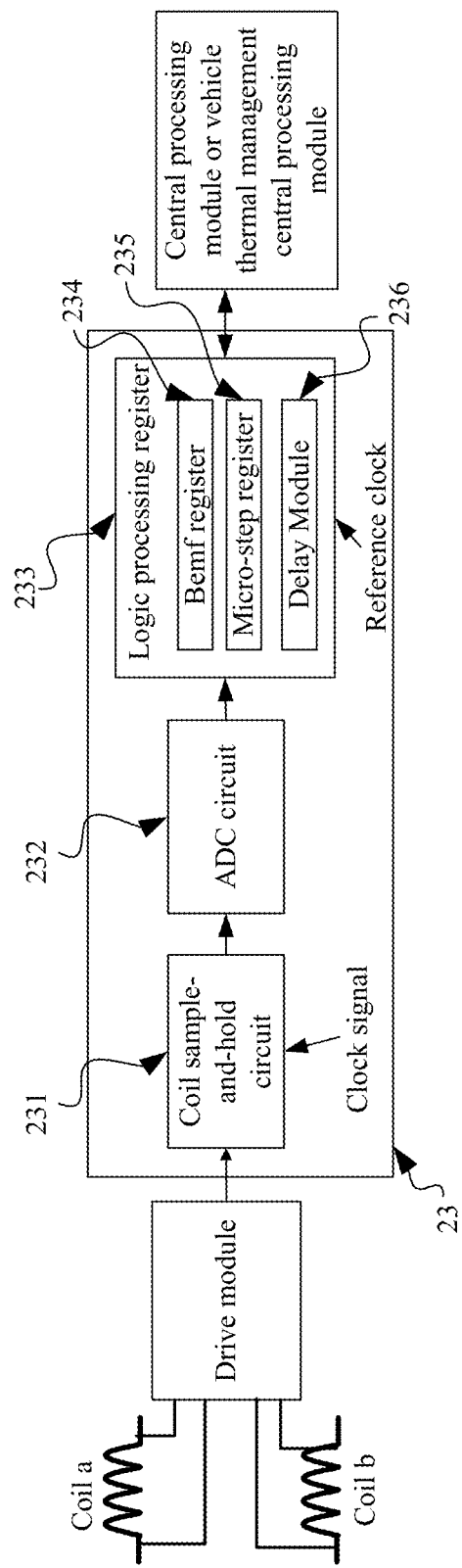
FIG. 3 is a schematic diagram of an embodiment of a drive control module shown in FIG. 1 or FIG. 2.

Referring to FIG. 3, in this embodiment, the drive control module 23 includes a coil sample-and-hold circuit 231, an ADC circuit 232 and a logic processing register 233. Assuming that, the motor 31 includes a coil a and a coil b. The coil sample-and-hold circuit 231 alternately selects one of the coils a and b as a current voltage sampling source, that is, the coil a is selected as the current voltage sampling source when starting sampling, and the coil b is selected as the current voltage sampling source for the next time, such that the sampling is performed alternately, and the voltage across two ends of the selected coil is sampled and output by the coil sample-and-hold circuit to the ADC circuit 232. The ADC circuit 232 converts an analog signal into the digital signal and outputs the digital signal to the logic processing register 233. The logic processing register 233 includes a bemf register 234 configured to store the digital signal sent by the ADC circuit 232, and the digital signal converted by the ADC circuit 232 is updated accordingly in the bemf register 234. The logic processing register 233, according to an inputted reference clock, controls the generation of a drive signal and sends the drive signal to the drive module. The logic processing register 233 may provide a clock signal to the coil sample-and-hold circuit 231, to enable that voltage sampling of the coil is performed only during a period in which no voltage is applied to any phase coil of the motor.

The logic processing register 233 further includes a micro-step register 235. A value stored in the micro-step register 235 is a micro-step value corresponding to the current running position of the motor. Therefore, by reading the value stored in the micro-step register, it can be determined at which micro-step position the motor is running currently. In a case that a set value for a motor stepping mode is 16 micro-steps (that is, a full step is divided into 16 micro-steps), a value range of the register may range from 0 to 63, and the range corresponds to 4 full steps, that is, one drive cycle. When the set value for the stepping mode is changed, the range of the register may be changed accordingly.

The drive control module 23 samples the voltage of the phase coil to which no voltage is applied during the period in which no voltage is applied to any phase coil of the motor, and converts the voltage of the phase coil into the digital signal, and stores the digital signal. During this period, the drive control module 23 samples the voltage of the coil multiple times. The number of times the voltage is sampled depends on a motor speed and a sampling frequency. Generally, the higher the motor speed and the greater the sampling frequency, the more the number of times the coil voltage is sampled, and each sample value of the coil voltage is updated to the bemf register 234 in real time.

The above sampling process is described below with reference to FIG. 4, FIG. 5 and FIG. 6.

Figure 4:
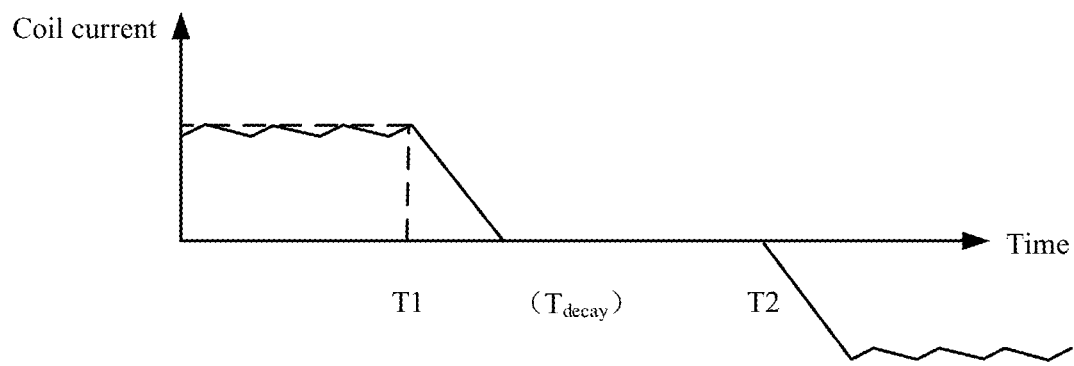
FIG. 4 is a schematic diagram showing the correspondence relationship between the current of a phase coil to which no voltage is applied and the time.
Figure 5:
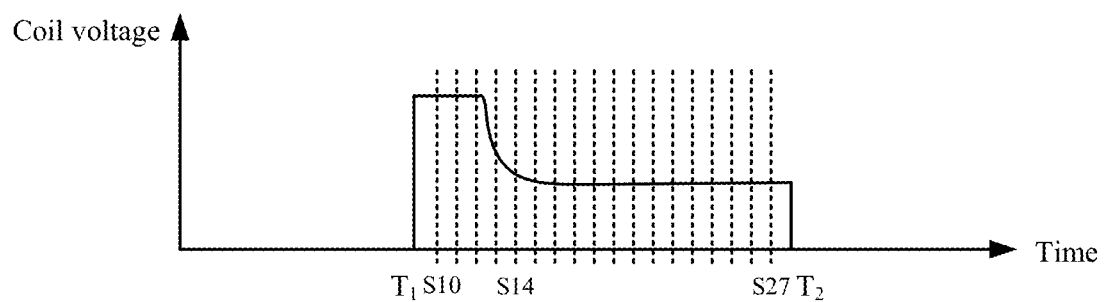
FIG. 5 is a schematic diagram showing the correspondence relationship between the voltage of a phase coil to which no voltage is applied and the time.
Figure 6:
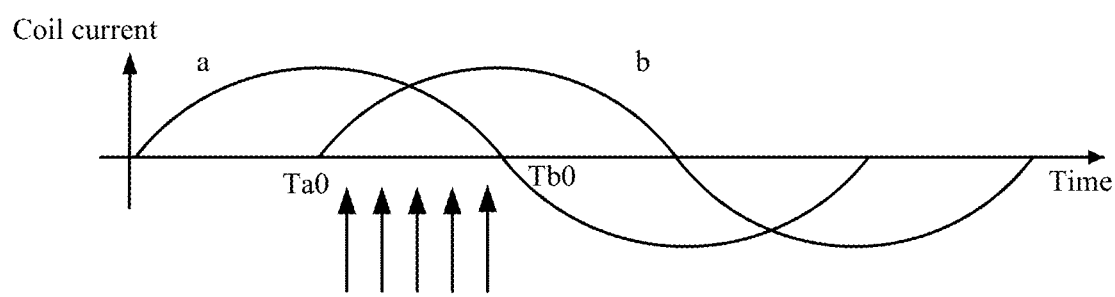
FIG. 6 is a schematic diagram showing the correspondence relationship between the currents of the a-phase coil and the b-phase coil of the motor and the time.

Referring to FIG. 6, a first time period $T_{a0}$ (corresponding to a micro-step value of 0) and a second time period $T_{b0}$ (corresponding to a micro-step value of 16) in FIG. 6 respectively correspond to two periods in which no voltage is applied to the a-phase coil and the b-phase coil. Sampling the coil voltage occurs in these periods, such that the micro-step value of 0, that is, a last sampled voltage value in the first time period $T_{a0}$, is stored in the bemf register 234 until the second time period $T_{b0}$. The first time period $T_{a0}$ corresponds to a period between a first time point $T_1$ and a second time point $T_2$ shown in FIG. 4. The drive control module 23 continuously samples the coil voltage between the first time point $T_1$ and the second time point $T_2$, and updates the sample value stored in the bemf register 234. As shown in FIG. 5, in this embodiment, according to the speed of the motor, the first sampling is S10 and the last sampling is S27. The number of times the voltage is sampled is 18, and each sample value is updated and stored in the bemf register 234. After the second time point $T_2$, the bemf register stores the last sample value until a starting point of the second period $T_{b0}$. As shown in FIG. 6, during a period from an ending point of the first time period $T_{a0}$ to the starting point of the second time period $T_{b0}$, the bemf register 234 always stores the last sample value.

As shown in FIG. 5, the first sampling S10 to the 18th sampling S27 occur in the first time period Tan, and the time period corresponds to the same micro-step value stored in the micro-step register 235. If the set value for the motor stepping mode is 16 micro-steps, the corresponding value range of the micro-step register 235 may range from 0 to 63, and this range corresponds to 4 full steps, that is, one drive cycle. The micro-step values are 0, 16, 32, and 48, respectively. When the micro-step value is 0, the micro-step value corresponds to the time period between the first time point $T_1$ and the second time point $T_2$ shown in FIG. 4.

Referring to FIG. 4, the first time point $T_1$ is a moment when the voltage is stopped from being applied to the coil, the current of the coil does not immediately become zero, and there is always a problem that the coil voltage between the first time point $T_1$ and a delay time point $T_{decay}$ is not an actual back electromotive force of the coil. Thus, a delay module 236 may be integrated in the logic processing register 233, such that the central processing module 22 reads the digital signal $bemf_i$ from the drive control module 23 after the delay time point $T_{decay}$, to allow the sampled coil voltage to more approximate to the actual back electromotive force, thereby further improving the reliability of control.

The control method of the embodiments of the present application is described below with reference to FIGS. 7-10.

Figure 7:
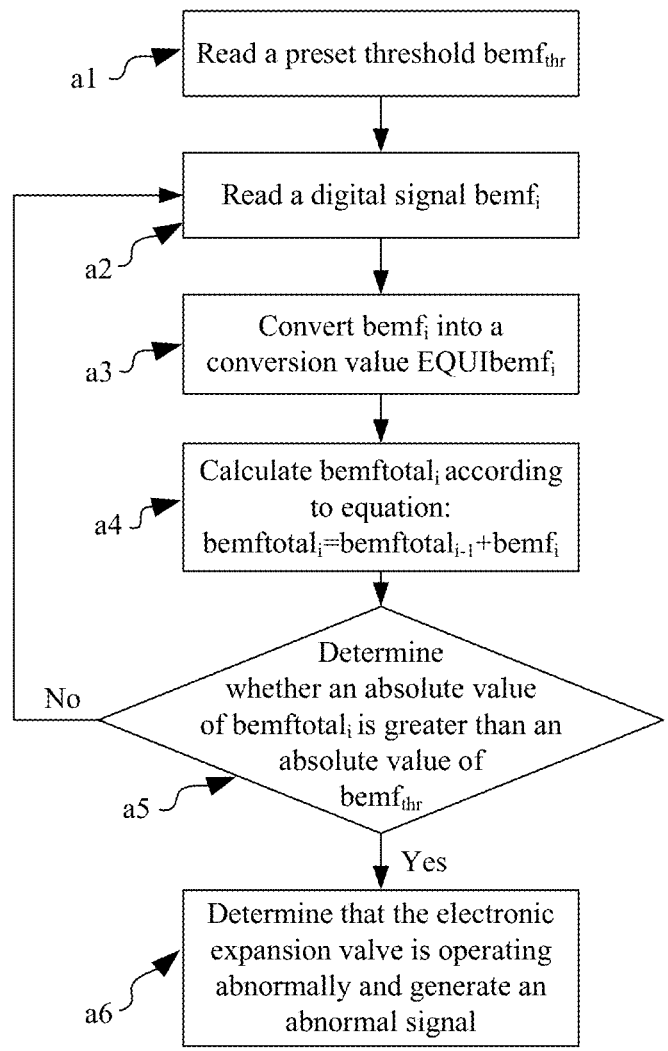
FIG. 7 is a schematic flow chart of a first embodiment of a control method according to the present application.

Referring to FIG. 7, in this embodiment, the control method is used for controlling the operating state of the motor. The control method is implemented by the above control system of the motor, and includes the following steps a1 to a6.

In Step a1, a preset threshold $bemf_{thr}$ is read.

In Step a2, a digital signal $bemf_i$ is read, where i represents the number of times the digital signal is read, i=1, 2 . . . .

In Step a3, the digital signal $bemf_i$ is converted into a conversion value $EQUIbemf_i$ by the central processing module, where an absolute value of a first conversion value corresponding to a digital signal with a high abnormality probability is greater than an absolute value of a second conversion value corresponding to a digital signal with a low abnormality probability, and a type of the preset threshold $bemf_{thr}$ is the same as a type of the conversion value $EQUIbemf_i$.

In Step a4, an accumulated value $bemftotal_i$ is calculated according to the equation $bemftotal_i = bemftotal_{i-1} + EQUIbemf_i$, where i represents the number of times the digital signal is read, i=1, 2 . . . , $bemftotal_{i-1}$ represents a previous accumulated value; and when i=1, the accumulated value $bemftotal_1 = bemftotal_0 + EQUIbemf_1$, where the $bemftotal_0 = 0$.

In Step a5, it is determined whether an absolute value of the accumulated value $bemftotal_i$ is greater than that of the preset threshold $bemf_{thr}$, if yes, Step a6 is performed, otherwise Step a2 is performed.

In Step a6, the central processing module determines that the motor is in an abnormal operation state and generates an abnormal signal.

The operating state of the motor includes the abnormal operation, and the abnormal operation includes a stalling state.

The control method further increases the reliability of control by converting the digital signal to the conversion value corresponding to the abnormal operation probability, accumulating the conversion values, and comparing the accumulated value with the preset threshold.

In this embodiment, the abnormality probability includes a stalling probability. The preset threshold may be a positive number or a negative number. If the preset threshold is a positive number, the first conversion value is a positive number. In the normal operating state, the conversion value corresponding to the digital signal at least includes a negative number. The accumulated value has a minimum value, and when the accumulated value is less than the minimum value, the minimum value is assigned to the accumulated value, and when the accumulated value is greater than the preset threshold, it is determined that the operating state of the motor is the abnormal operation, and it is further determined that the motor is stalled.

If the preset threshold is a negative number, the first conversion value corresponding to the digital signal with a high abnormality probability is a negative number. In the normal operating state, the conversion value corresponding to the digital signal at least includes a positive number. The accumulated value has a maximum value, and when the accumulated value is greater than the maximum value, the maximum value is assigned to the accumulated value, and when the accumulated value is less than the preset threshold, it is determined that the operating state of the motor is the abnormal operation, and it is further determined that the motor is stalled.

Figure 8:
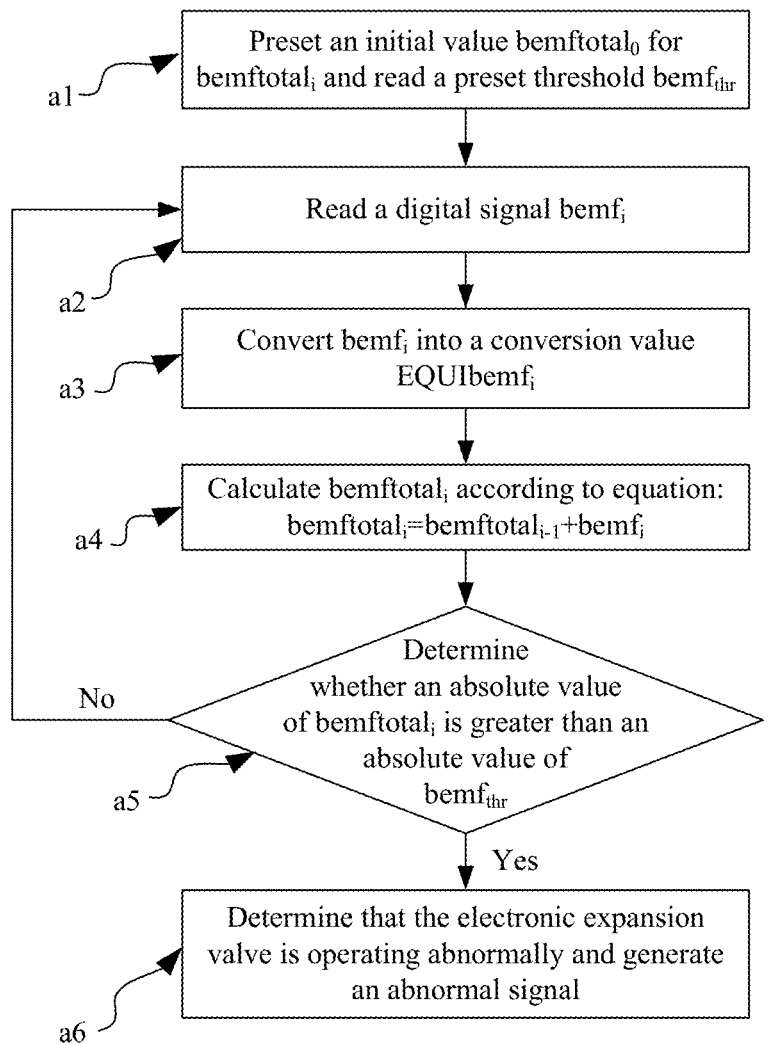
FIG. 8 is a schematic flow chart of a second embodiment of the control method according to the present application.

FIG. 8 is a flow chart of a second embodiment of the control method. In this embodiment, the control method of the motor is used for controlling the operating state of the motor. The control method is implemented by the above control system of the motor, and includes the following steps a1 to a6.

In Step a1, an initial value $bemftotal_0$ of the accumulated value $bemftotal_i$ is preset and a preset threshold $bemf_{thr}$ is read.

In Step a2, a digital signal $bemf_i$ is read, where i represents the number of times the digital signal is read, i=1, 2 . . . .

In Step a3, a digital signal $bemf_i$ is converted into a conversion value $EQUIbemf_i$, where an absolute value of a first conversion value corresponding to a digital signal with a high abnormality probability is greater than an absolute value of a second conversion value corresponding to a digital signal with a low abnormality probability, a type of the preset initial value $bemftotal_0$ of the accumulated value $bemftotal_i$ is the same as a type of the conversion value $EQUIbemf_i$, and a type of the preset threshold $bemf_{thr}$ is the same as the type of the conversion value $EQUIbemf_i$.

In Step a4, an accumulated value $bemftotal_i$ is calculated according to the equation $bemftotal_i = bemftotal_{i-1} + EQUIbemf_i$, where i=1, 2 . . . , and $bemftotal_{i-1}$ represents a previous accumulated value, and when i=1, the accumulated value $bemftotal_1 = bemftotal_0 + EQUIbemf_1$, the $bemftotal_0$ is the initial value; the current accumulated value equals to the sum of the previous accumulated value and the conversion value corresponding to the current digital signal, and the first accumulated value equals to the sum of the initial value and the conversion value corresponding to the first read digital signal.

In Step a5, it is determined whether an absolute value of the accumulated value $bemftotal_i$ is greater than an absolute value of the preset threshold $bemf_{thr}$, if yes, Step a6 is performed, otherwise Step a2 is performed.

In Step a6, the central processing module determines that the motor is in an abnormal operation state and generates an abnormal signal.

Compared with the first embodiment, the initial value of the accumulated value in this embodiment is preset according to the motor speed and the motor properties, which further improves the reliability of the control system.

Figure 9:
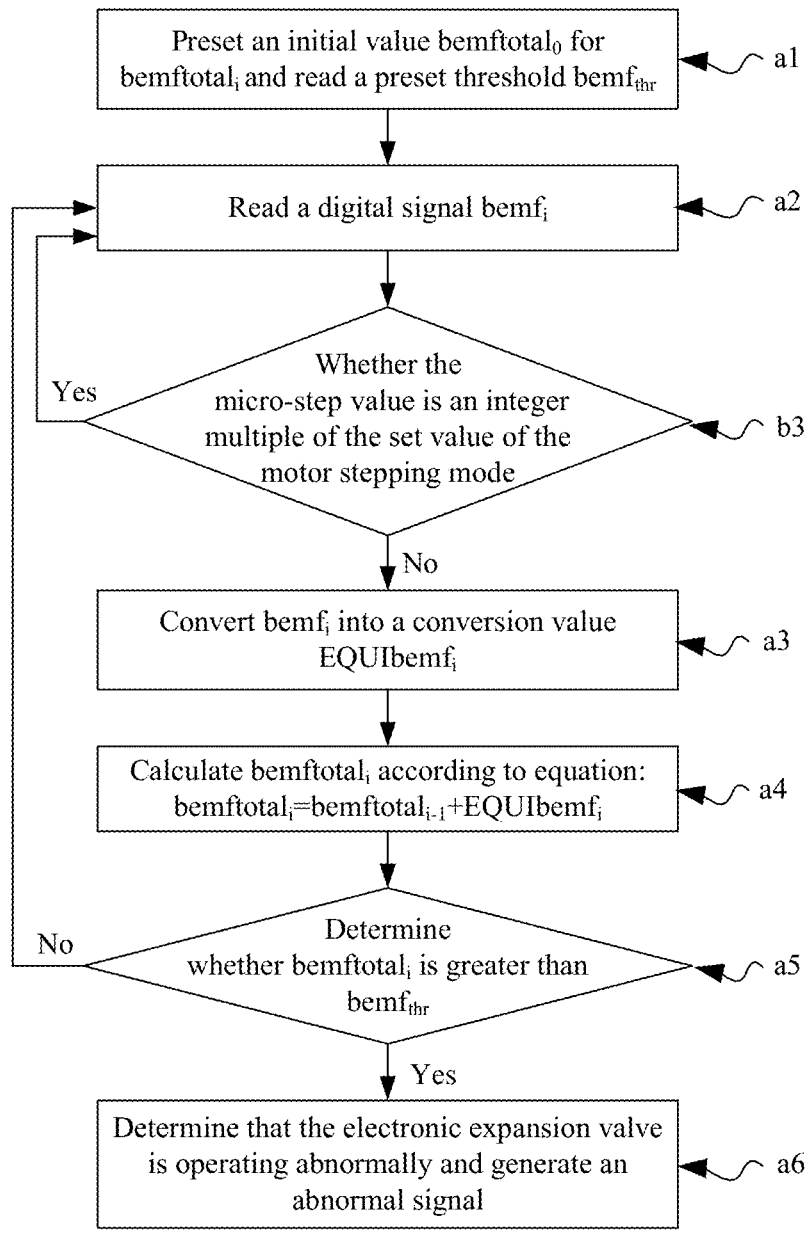
FIG. 9 is a schematic flow chart of a third embodiment of the control method according to the present application.

FIG. 9 is a flow chart of a third embodiment of the control method. In this embodiment, the control method of the motor is used for controlling the operating state of the motor. The control method is implemented by the above control system of the motor, and includes the following steps a1 to a6.

In Step a1, an initial value $bemftotal_0$ of an accumulated value $bemftotal_i$ is preset and a preset threshold $bemf_{thr}$ is read.

In Step a2, a digital signal $bemf_i$ is read by the central processing module, where i represents the number of times the digital signal is read, and i=1, 2 . . . .

In Step b3, it is determined whether a moment when the central processing module reads the digital signal belongs to a period in which no voltage is applied to any phase coil of the motor, and if yes, Step a2 is performed, otherwise Step a3 is performed.

In Step a3, the digital signal $bemf_i$ is converted into a conversion value $EQUIbemf_i$, where an absolute value of a first conversion value corresponding to a digital signal with a high abnormality probability is greater than an absolute value of a second conversion value corresponding to a digital signal with a low abnormality probability, a type of the preset initial value $bemftotal_0$ of the accumulated value $bemftotal_i$ is the same as a type of the conversion value $EQUIbemf_i$, and a type of the preset threshold $bemf_{thr}$ is the same as a type of the conversion value $EQUIbemf_i$.

In Step a4, the accumulated value $bemftotal_i$ is calculated according to the equation $bemftotal_i = bemftotal_{i-1} + EQUIbemf_i$, where i represents the number of times the digital signal is read, and i=1, 2 . . . .

In Step a5, it is determined whether the accumulated value $bemftotal_i$ is greater than the preset threshold $bemf_{thr}$, if yes, Step a6 is performed, otherwise Step a2 is performed.

In Step a6, the central processing module determines that the motor is in an abnormal operation state and generates an abnormal signal.

Compared with the second embodiment, in this embodiment, it is determined whether the moment when the central processing module reads the digital signal belongs to the period in which no voltage is applied to any phase coil of the motor, then the time for the central processing module reading the digital signal $bemf_i$ is set to be after the second time period $T_{b0}$, which avoids a situation that the sampled voltage value of the coil is greater than the back electromotive force value, thereby further improving the reliability of the control system.

Figure 10:
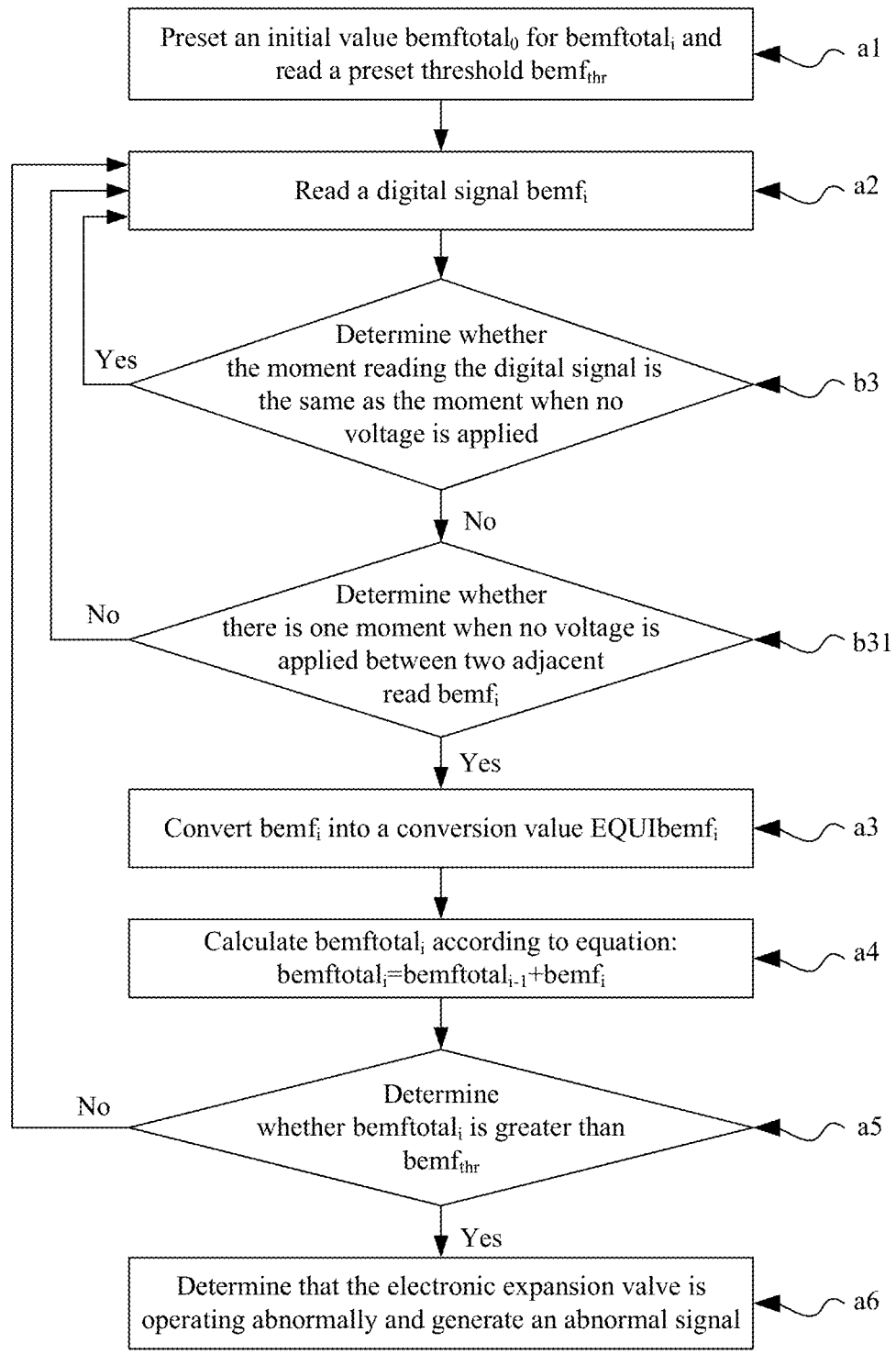
FIG. 10 is a schematic flow chart of a fourth embodiment of the control method according to the present application.

FIG. 10 is a flow chart of a fourth embodiment of the control method. In this embodiment, the control method of the motor is used for controlling the operating state of the motor. The control method is implemented by the above control system of the motor, and includes the following steps a1 to a6.

In Step a1, an initial value $bemftotal_0$ of an accumulated value $bemftotal_i$ is preset and a preset threshold $bemf_{thr}$ is read.

In Step a2, a digital signal $bemf_i$ is read, where i represents the number of times the digital signal is read, and i=1, 2 . . . .

In Step b3, it is determined whether a moment when the central processing module reads the digital signal belongs to a period in which no voltage is applied to any phase coil of the motor, and if yes, Step a2 is performed, otherwise Step b31 is performed.

In Step b31, it is determined whether there is one time period, in which no voltage is applied to any phase coil of the motor, included between two adjacent read digital signals, and if yes, Step a3 is performed, and otherwise Step a2 is performed.

In Step a3, the digital signal $bemf_i$ is converted into a conversion value $EQUIbemf_i$, where an absolute value of a first conversion value corresponding to a digital signal with a high abnormality probability is greater than an absolute value of a second conversion value corresponding to a digital signal with a low abnormality probability, a type of the initial value bemftotal$_0$ of the accumulated value bemftotal$_i$ is the same as a type of the conversion value EQUIbemf$_i$, and a type of the preset threshold bemf$_{thr}$ is the same as a type of the conversion value EQUIbemf$_i$.

In Step a4, the accumulated value bemftotal$_i$ is calculated by the central processing module according to the equation bemftotal$_i$=bemftotal$_{i-1}$+EQUIbemf$_i$, where i represents the number of times the digital signal is read, and i=1, 2 . . . .

In Step a5, it is determined by the central processing module whether the accumulated value bemftotal$_i$ is greater than the preset threshold bemf$_{thr}$, if yes, Step a6 is performed, otherwise Step a2 is performed.

In Step a6, the central processing module determines that the motor is in an abnormal operation state and generates an abnormal signal.

Compared with the third embodiment, Step b31 is added in this embodiment, such that between the first time period T$_{a0}$ and the second time period T$_{b0}$, the value of the digital signal bemf$_i$ is read only once and then calculated, which can improve the efficiency of control.

Apparently, Step b31 may be the following step or the following step may be provided after the step b31: it is determined whether the digital signal is read once between two adjacent periods in which no voltage is applied to any phase coil of the motor, and if yes, Step a3 is performed, otherwise Step a2 is performed, which is advantageous for preventing the signal from jumping and improving the accuracy of control.

The control method further includes Step b2 after or before Step a1. In Step b2, the motor speed is controlled to avoid resonance intervals of the motor, where the speed corresponding to the resonance intervals of the motor is related to properties of the motor itself, and Step b2 is not shown in the specific embodiment.

It should be noted that the above embodiments are only for explaining the present application and are not intended to limit the technical solutions described in the present application. Although the present application has been described in detail with reference to the above embodiments, those skilled in the art should understand that modification or equivalently replacement may be made to the present application by those skilled in the art, and all the technical solutions and improvements thereof without departing from the spirit and scope of the present application falSUB1 within the scope of the claims.

The invention claimed is:

1. A control system, wherein, the control system is configured to control a motor, and comprises a central processing module and a drive control module;
when the motor is running, the drive control module is configured to sample a voltage of a phase coil of the motor, to which no voltage is applied, during a period in which no voltage is applied to any phase coil of the motor, and convert the sampled voltage of the phase coil of the motor, to which no voltage is applied, into a digital signal;
the control system is configured to store the digital signal, and update the digital signal in real time during the period in which no voltage is applied to any phase coil of the motor;
the central processing module is configured read the digital signal, and the control system is configured to convert the digital signal into a conversion value according to an abnormality probability of the motor running abnormally; and
the central processing module is configured to sequentially accumulate the conversion values to obtain an accumulated value, and determine an operating state of the motor according to a relationship between the accumulated value and a preset threshold.

2. The control system according to claim 1, wherein, the control system being configured to convert the digital signal into a conversion value according to an abnormality probability of the motor running abnormally is implemented as follows: the control system is configured to convert the digital signal into a first conversion value when the abnormality probability of the motor is higher than a preset probability threshold; and
convert the digital signal into a second conversion value when the abnormality probability of the motor is lower than the preset probability threshold, wherein an absolute value of the first conversion value is greater than an absolute value of the second conversion value.

3. The control system according to claim 2, wherein the preset threshold is a positive number, and the first conversion value is a positive number; if the motor is in a normal operating state, the conversion value corresponding to the digital signal at least comprises a negative number; and
the accumulated value has a minimum value, and when the accumulated value is less than the minimum value, the minimum value is assigned to the accumulated value; and when the accumulated value is greater than the preset threshold, it is determined that the operating state of the motor is an abnormal operation.

4. The control system according to claim 3, wherein the central processing module is further configured to set an initial value for the accumulated value, a type of the initial value is the same as a type of the preset threshold, and the accumulated value is equal to a sum of a previous accumulated value and the conversion value obtained by converting a current digital signal, wherein the first accumulated value is equal to the sum of the initial value and the conversion value converted from the digital signal read for the first time.

5. The control system according to claim 2, wherein the preset threshold is a negative number, and the first conversion value is a negative number; if the motor is in the normal operating state, the conversion value corresponding to the digital signal at least comprises a positive number; and
the accumulated value has a maximum value, and when the accumulated value is greater than the maximum value, the maximum value is assigned to the accumulated value; and when the accumulated value is less than the preset threshold, it is determined that the operating state of the motor is the abnormal operation.

6. The control system according to claim 2, wherein the central processing module is further configured to set an initial value for the accumulated value, a type of the initial value is the same as a type of the preset threshold, and the accumulated value is equal to a sum of a previous accumulated value and the conversion value obtained by converting a current digital signal, wherein the first accumulated value is equal to the sum of the initial value and the conversion value converted from the digital signal read for the first time.

7. The control system according to claim 1, wherein the central processing module is further configured to set an initial value for the accumulated value, a type of the initial value is the same as a type of the preset threshold, and the accumulated value is equal to a sum of a previous accumulated value and the conversion value obtained by converting a current digital signal, wherein the first accumulated value is equal to the sum of the initial value and the conversion value converted from the digital signal read for the first time.

8. The control system according to claim 7, wherein one full step of motor operation comprises at least two micro-steps and the drive control module further comprises a micro-step register; and the micro-step register is configured to store a current micro-step value of the motor, and the period in which no voltage is applied to any phase coil of the motor corresponds to a same micro-step value, and a moment when the central processing module reads the digital signal does not belong to the period in which no voltage is applied to any phase coil of the motor.

9. The control system according to claim 8, wherein, one period, in which no voltage is applied to any phase coil of the motor, is included between the two adjacent moments when the central processing module reads the digital signal.

10. The control system according to claim 8, wherein, the central processing module at least reads the digital signal once between the two adjacent periods in which no voltage is applied to any phase coil of the motor.

11. The control system according to claim 8, wherein the abnormal operation comprises motor stalling; and the central processing module is further configured to control a speed of the motor to avoid a speed corresponding to one or more resonance intervals of the motor, and the speed corresponding to the resonance intervals of the motor is related to properties of the motor itself.

12. A control method, wherein the control method is used for controlling a motor, the motor is controlled by a control system, and the control system comprises a central processing module and a drive control module;

when the motor is running, the drive control module is configured to sample a voltage of a phase coil of the motor, to which no voltage is applied, during a period in which no voltage is applied to any phase coil of the motor, and convert the voltage of the phase coil of the motor, to which no voltage is applied, into a digital signal;

the control system is configured to store the digital signal, and update the digital signal in real time during the period in which no voltage is applied to any phase coil of the motor;

the central processing module is configured to read the digital signal and perform the control method, and the control method comprises the following steps:

a1, reading a preset threshold $bemf_{thr}$;

a2, reading a digital signal $bemf_i$, wherein i represents the number of times the digital signal is read, and i=1, 2 . . . ;

a3, converting, according to an abnormality probability, the digital signal $bemf_i$, into a corresponding conversion value $EQUIbemf_i$, wherein i represents the number of times the digital signal is read, and i=1, 2 . . . ;

a4, calculating an accumulated value $bemftotal_i$ according to an equation $bemftotal_i = bemftotal_{i-1} + EQUIbemf_i$, wherein i represents the number of times the digital signal is read, i=1, 2 . . . , $bemftotal_{i-1}$ is a previous accumulated value, and when i=1, the accumulated value $bemftotal_0 = 0$;

a5, comparing the accumulated value $bemftotal_i$ with the preset threshold $bemf_{thr}$; and a6, determining whether an absolute value of the accumulated value $bemftotal_i$ is greater than an absolute value of the preset threshold $bemf_{thr}$, and if yes, determining an operating state of the motor, and otherwise proceeding to Step a2.

13. The control method according to claim 12, further comprising:

determining the motor is in an abnormal operation state and generating an abnormal signal by the central processing module when the absolute value of the accumulated value $bemftotal_i$ is greater than that of the preset threshold $bemf_{thr}$.

14. The control method according to claim 12, further comprising Step b3 between step a2 and step a3;

Step b3, determining whether a moment, when the central processing module reads the digital signal, belongs to the period in which no voltage is applied to any phase coil of the motor, and if yes, proceeding to Step a2, and otherwise proceeding to Step a3.

15. The control method according to claim 14, further comprising Step b31 after Step b3;

Step b31, determining whether there is one period, in which no voltage is applied to any phase coil of the rotor, between two adjacent moments when the digital signal is read, and if yes proceeding to Step a3, and otherwise proceeding to Step a2.

16. The control method according to claim 15, wherein, the abnormal operation comprises motor stalling, and the control method further comprises Step b2 after or before Step a1;

Step b2, controlling a speed of the motor to avoid resonance intervals of the motor, wherein a speed corresponding to the resonance intervals of the motor is related to properties of the motor itself.

17. The control method according to claim 14, further comprising Step b31 after Step b3;

Step b31, determining whether the digital signal is read once between two adjacent periods in which no voltage is applied to any phase coil of the motor, and if yes, proceeding to Step a3, and otherwise proceeding to Step a2.

18. A control method, wherein the control method is used for controlling a motor, the motor is controlled by a control system, and the control system comprises a central processing module and a drive control module;

when the motor is running, the drive control module is configured to sample a voltage of a phase coil of the motor, to which no voltage is applied, during a period in which no voltage is applied to any phase coil of the motor, and convert the voltage of the phase coil of the motor, to which no voltage is applied, into a digital signal;

the control system is configured to store the digital signal, and update the digital signal in real time during the period in which no voltage is applied to any phase coil of the motor;

the central processing module is configured to read the digital signal and perform the control method, and the control method comprises the following steps:

a1, reading a preset threshold $bemf_{thr}$ and setting an initial value $bemftotal_0$;

a2, reading a digital signal $bemf_i$, wherein i represents the number of times the digital signal is read, and i=1, 2 . . . ;

a3, converting, according to an abnormality probability, the digital signal $bemf_i$, into a corresponding conversion value $EQUIbemf_i$, wherein i represents the number of times the digital signal is read, and i=1, 2 . . . ;

a4, calculating an accumulated value $bemftotal_i$ according to an equation $bemftotal_i = bemftotal_{i-1} + EQUIbemf_i$, wherein i represents the number of times the digital signal is read, i=1, 2 . . . , bemftotal$_{i-1}$ is a previous accumulated value, and when i=1, the accumulated value bemftotal$_i$=bemftotal$_0$+EQUIbemf$_i$;

a5, comparing the accumulated value bemftotal$_i$ with the preset threshold bemf$_{thr}$; and a6, determining whether an absolute value of the accumulated value bemftotal$_i$ is greater than an absolute value of the preset threshold bemf$_{thr}$ by the central processing module, and if yes, determining an operating state of the motor, and otherwise proceeding to Step a2.

19. The control method according to claim 18, further comprising:

determining the motor is in an abnormal operation state and generating an abnormal signal by the central processing module when the absolute value of the accumulated value bemftotal$_i$ is greater than that of the preset threshold bemf$_{thr}$.

20. The control method according to claim 18, further comprising Step b3 between step a2 and step a3;

Step b3, determining whether a moment, when the central processing module reads the digital signal, belongs to the period in which no voltage is applied to any phase coil of the motor, and if yes, proceeding to Step a2, and otherwise proceeding to Step a3.

* * * * *